(12) United States Patent
Oodaira et al.

(10) Patent No.: US 6,653,868 B2
(45) Date of Patent: Nov. 25, 2003

(54) SEMICONDUCTOR INTEGRATED CIRCUIT, METHOD AND PROGRAM FOR DESIGNING THE SEMICONDUCTOR INTEGRATED CIRCUIT

(75) Inventors: Nobuhiro Oodaira, Akishima (JP); Hiroyuki Mizuno, Tokyo (JP); Yusuke Kanno, Hachioji (JP); Koichiro Ishibashi, Warabi (JP); Masanao Yamaoka, Hachioji (JP)

(73) Assignees: Renesas Technology Corporation, Tokyo (JP); Hitachi Ulsi Systems Co., Ltd., Tokyo (JP)

( * ) Notice: Subject to any disclaimer, the term of this patent is extended or adjusted under 35 U.S.C. 154(b) by 0 days.

(21) Appl. No.: 10/173,035

(22) Filed: Jun. 18, 2002

(65) Prior Publication Data

US 2003/0016055 A1 Jan. 23, 2003

(30) Foreign Application Priority Data

Jul. 17, 2001 (JP) ......................... 2001-216387

(51) Int. Cl.[7] ............................................. H03K 19/094
(52) U.S. Cl. ............................ 326/121; 326/17; 326/36; 326/19
(58) Field of Search ............................... 326/17, 35, 36, 326/112, 119, 121

(56) References Cited

U.S. PATENT DOCUMENTS 6,380,764 B1 * 4/2002 Katoh et al. .................. 326/93
6,563,180 B2 * 5/2003 Ishibashi et al. ............. 257/391

FOREIGN PATENT DOCUMENTS

JP          11-195976          12/1997

* cited by examiner

Primary Examiner—Anh Tran

(57) ABSTRACT

A semiconductor integrated circuit that is well-balanced between increased operating speed and decreased power consumption caused by a leakage current. The gate cells of the circuit comprised of low threshold voltage MOSs are used for logic gates provided with three or more inputs, and gate cells comprised of high threshold voltage MOSs are generally used for logic gates provided with one or two inputs, sometimes on a case-by-case basis.

11 Claims, 7 Drawing Sheets

SEMICONDUCTOR INTEGRATED CIRCUIT, METHOD AND PROGRAM FOR DESIGNING THE SEMICONDUCTOR INTEGRATED CIRCUIT

CLAIM OF PRIORITY

This application claims priority to Japanese Patent Application No. 2001-216387 filed on Jul. 17, 2001.

BACKGROUND OF THE INVENTION

1. Field of the Invention

The present invention relates to semiconductor integrated circuits, and, more particularly, the present invention relates to a semiconductor integrated circuit with preferably fast operation and power-saving properties, as well as methods and programs for designing the semiconductor integrated circuit.

2. Description of the Background

Insulated gate field effect transistors (referred to as "MOS" or "MOSFET" herein) have preferably high integration and power saving characteristics. These beneficial characteristics account for the transistors wide use in various semiconductor integrated circuit devices. The on/off (switching) characteristics of the MOS are determined by the threshold voltage. To improve the MOS's driving ability, as well as to improve the operational speed of the subject circuit, it is effective to set a lower threshold voltage for the MOS. It should be noted have that an enhancement type MOS takes a positive value while the PMOS takes a negative value as the threshold voltage. Hereinafter, unless otherwise specifically mentioned, the threshold voltage level refers to an absolute value.

On the other hand, in the case where an excessively low threshold voltage is set for the MOS, the MOS cannot be turned off completely even when the gate-source voltage thereof is set to 0. The subthreshold leakage current therefore increases. For an LSI (Large Scale Integration) that is required to have the properties of high integration and low power consumption, the power consumption caused by such a leakage current in the stand-by state increases to a point where it is no longer negligible.

To address these complications, the official gazette of JP-A 195976/1999 discloses a technique that configures an LSI using a plurality of MOSs that have different threshold voltages. According to the described technique, priority is given to lower threshold voltage MOSs used for gate cells located in a path which requires faster operational speed and higher threshold voltage MOSs are used for other gate cells so that the LSI can cope with both fast operation and low power consumption properties.

An LSI, in which a plurality of MOSs with different threshold voltages are mixed in this way may be designed as follows. Initially, logical synthesis is undertaken with gate cells comprised of high threshold voltage MOSs, and the delay of each path in the logical-synthesized circuit block is then evaluated. Thereafter, each gate cell in a path that has a significant delay and determines the operation frequency of the subject circuit (e.g., the "critical path") is replaced with a gate cell comprised of low threshold voltage MOSs.

In the case of the above conventional technique, because a gate cell composed of high threshold voltage MOSs is used for the first logical synthesis step, the first step cannot satisfy a fast operational speed requirement of the circuit when such a speed requirement is high.

It is therefore expected that the logical synthesis step may often be repeated many times. In spite of this, it may be possible to reduce the logical synthesizing time if a fast operation circuit is obtained while the low power consumption property is kept up to a certain degree in the first logical synthesis step.

Multiple-input logic gates (especially, logic gates with four or more inputs) are not typically used in conventional logical synthesis. In the case of a 4-input NAND gate, for example, because four NMOSs are connected serially, the subject circuit becomes slow in operation speed when high threshold voltage MOSs are used for the gate. This occurs because the operational current is insufficient. This is the reason that it is rare to find a logical circuit comprised of multiple-input logic gates.

Under these circumstances, the present invention preferably provides a semiconductor integrated circuit that is well-balanced between low power consumption and fast operational properties. The present invention also provides a method for enabling logical synthesis so as to design such a semiconductor integrated circuit in a reduced amount of time.

SUMMARY OF THE INVENTION

In at least are preferred embodiment, the semiconductor integrated circuit of the present invention is designed so that each logic gate circuit with three or more inputs uses gate cells comprised of low threshold voltage MOS respectively.

Specifically, the semiconductor integrated circuit of the present invention includes: a first operating potential point; a second operating potential point; a plurality of first logic gates in each of which a first insulated gate field effect transistor is included among a plurality of insulated gate field effect transistors connected serially between the first and second operating potential points while no insulated gate field effect transistor of the same conductivity type as that of the first insulated gate field effect transistor is included among a plurality of the insulated gate field effect transistors connected serially between the first and second operating potential points; a plurality of second logic gates in each of which at least three or more second insulated gate field effect transistors of the first conductivity type are included among a plurality of insulated gate field effect transistors connected serially between the first and second operating potential points, and the absolute threshold voltage of the second insulated gate field effect transistor is lower than that of the first insulated gate field effect transistor.

The low threshold voltage MOSs employed here are all to be stacked. The complementary action MOSs may be any of higher threshold voltage MOSs or same threshold voltage MOSs. When the variation among processes and the like are taken into consideration, the threshold voltage of the complementary action insulated gate field effect transistors are required only to satisfy a condition that the difference between the absolute threshold voltage of the first insulated gate field effect transistor and that of complementary action insulated gate field effect transistors becomes larger than the difference between the absolute threshold voltage of the second insulated gate field effect transistor and that of the complementary action insulated gate field effect transistors.

When designing a semiconductor integrated circuit, priority is given to design gate cells comprised of low threshold voltage MOSs for each logic gate circuit with three or more inputs, while priority is given to gate design cells comprised of high threshold MOSs for each logic circuit gate with one input. The present invention further provides a program used for the design process.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

An examination of the relationship between each input signal and a leakage current of a multiple-input logic gate of conventional circuits shows that such a multiple-input logic gate has a so-called "stack structure" in which a plurality of MOSs of the same conductivity are connected serially between an output node Zn and a power supply line (VDD or VSS) thereof.

Figure 2A:
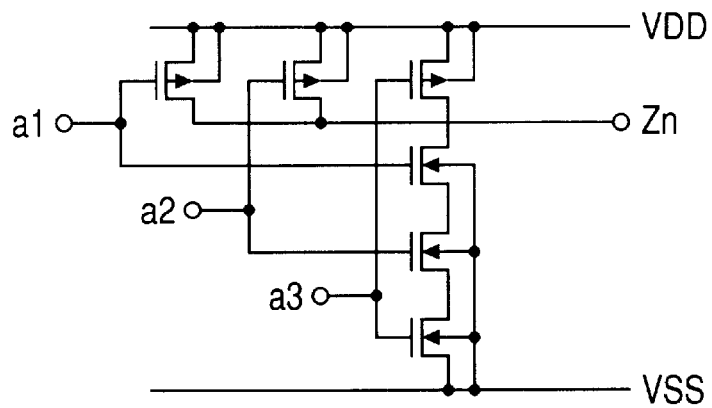
FIG. 2A is a circuit diagram of a 3-input NAND circuit and FIG. 2B is a chart for describing the power consumption caused by a leakage current in the input state of the 3-input NAND circuit.
Figure 2B:
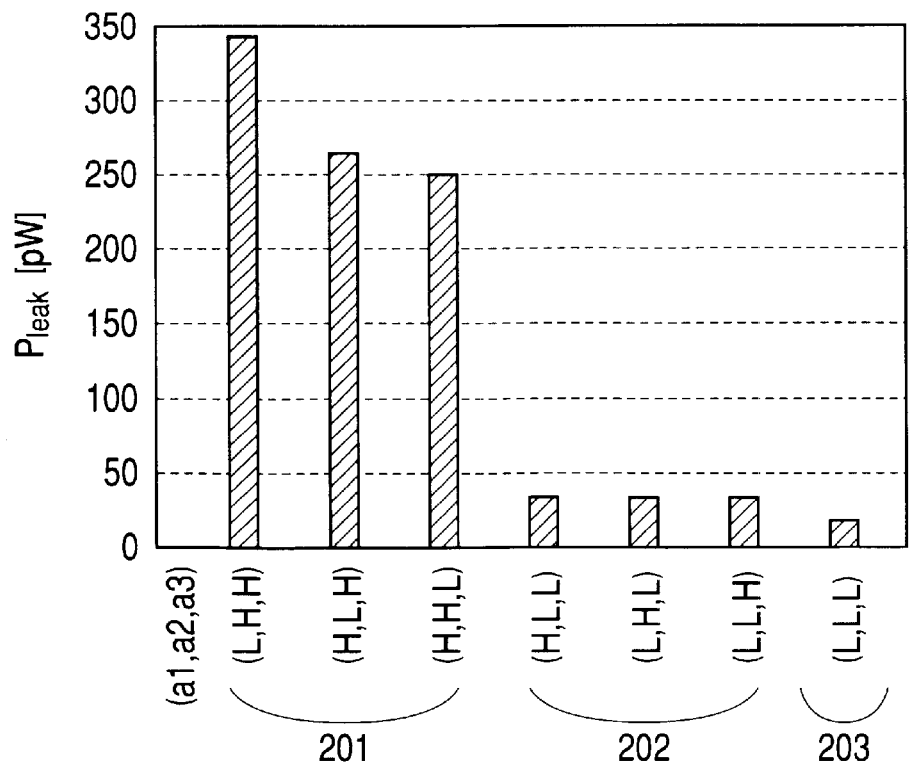

FIG. 2A shows a circuit diagram of a 3-input NAND gate circuit, and FIG. 2B shows simulation results of the relationship between each input signal (a1, a2, a3) and the power consumption Pleak caused by a leakage current of the 3-input NAND gate circuit. In this typical example, the supply voltage VDD is 1.0V, the threshold voltage (absolute value) $V_{th}$ is 0.3V, the junction temperature $T_j$ is 25° C., and the gate width and the gate length of the MOS are 1.5 $\mu$m and 0.15 $\mu$m respectively.

When one of the input signals (a1, a2, a3) goes into the low level (to be described hereinafter as "L"), the output node Zn goes into the high level (hereinafter, "H"). Reference numeral 201 denotes that one of the three inputs is "L," and reference numeral 202 denotes that two of the three inputs are "L." Reference numeral 203 denotes that all the three inputs are "L."

When two or more of the three inputs are "L" and a plurality of MOSs are turned off, the power consumption caused by a leakage current becomes about 40 pW. However, when only one of the three inputs is "L," the power consumption caused by a leakage current becomes 250 pW or higher. The power consumption therefore is reduced by more than 80% in this case.

Furthermore, the number of possible input signal combinations utilizing three inputs is eight types including a case in which all three inputs are "H," which is not shown in FIG. 2B. When all three inputs are "H," a subthreshold leakage current flows in the PMOSs in a parallel connection and the power consumption at this time is the largest. The subthreshold current, which affects the gate width of each transistor, is expected to be about three times the subthreshold current when one of the three inputs is "L." In the case where each input signal is alternated between "H" and "L" evenly, however, the probability that the largest subthreshold current flows in an input signal is ⅛ while the probability that the subthreshold current is reduced significantly in an input signal is ⅞. It is therefore clear that the average power consumption caused by a leakage current in such a 3-input NAND gate does not increase proportionally to a reduction of the threshold voltage of the transistors.

Generally, in the case where the difference between a low threshold voltage and a high threshold voltage of MOSs is 0.1V, the subthreshold current of the low threshold voltage MOS becomes about ten times that of the high threshold voltage MOS. This is why the subthreshold current of a 1-input logic gate, for example an inverter, comprised of low threshold voltage MOSs becomes about ten times that of an inverter comprised of high threshold voltage MOSs. In spite of this, when a multiple-input logic gate is comprised of low threshold voltage MOSs, the leakage current reduction effect as described above appears. The difference, therefore, is not clear as between the average power consumption caused by a subthreshold current when a multiple-input logic gate is comprised of low threshold MOSs and the average power consumption of the subthreshold current of an inverter comprised of low threshold MOSs from which no leakage current reduction effect is obtained.

On the contrary, a multiple-input logic gate comprised of low threshold voltage MOSs will not suffer from a slow operation speed, which has been a drawback of the multiple-input logic gate comprised of high threshold voltage MOSs. In addition, it may also be possible to reduce the number of logic gates from each path through the use of multiple-input logic gates, thereby speeding up the operation of the subject circuit. On the other hand, power consumption, when it is caused by a leakage current, does not increase even when low threshold voltage MOSs are used, or it is expected that the whole power consumption of the circuit can be reduced if the number of logic gates is reduced. The present invention preferably provides a semiconductor integrated circuit that is well-balanced between low power consumption and fast operation speed because the circuit uses low threshold voltage MOSs for multiple-input logic gates, especially for logic gates with three or more inputs.

Figure 3A:
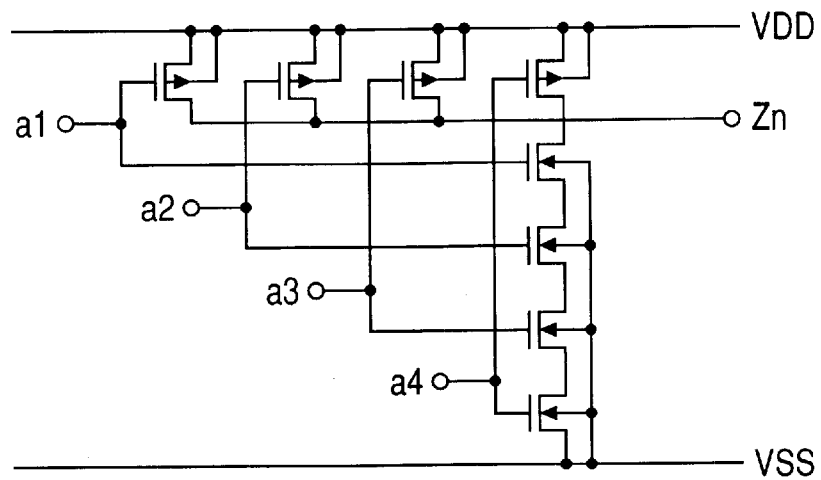
FIG. 3A is a circuit diagram of a 4-input NAND circuit and FIG. 3B is a chart for describing the power consumption caused by a leakage current in the input state of said 4-input NAND circuit.
Figure 3B:
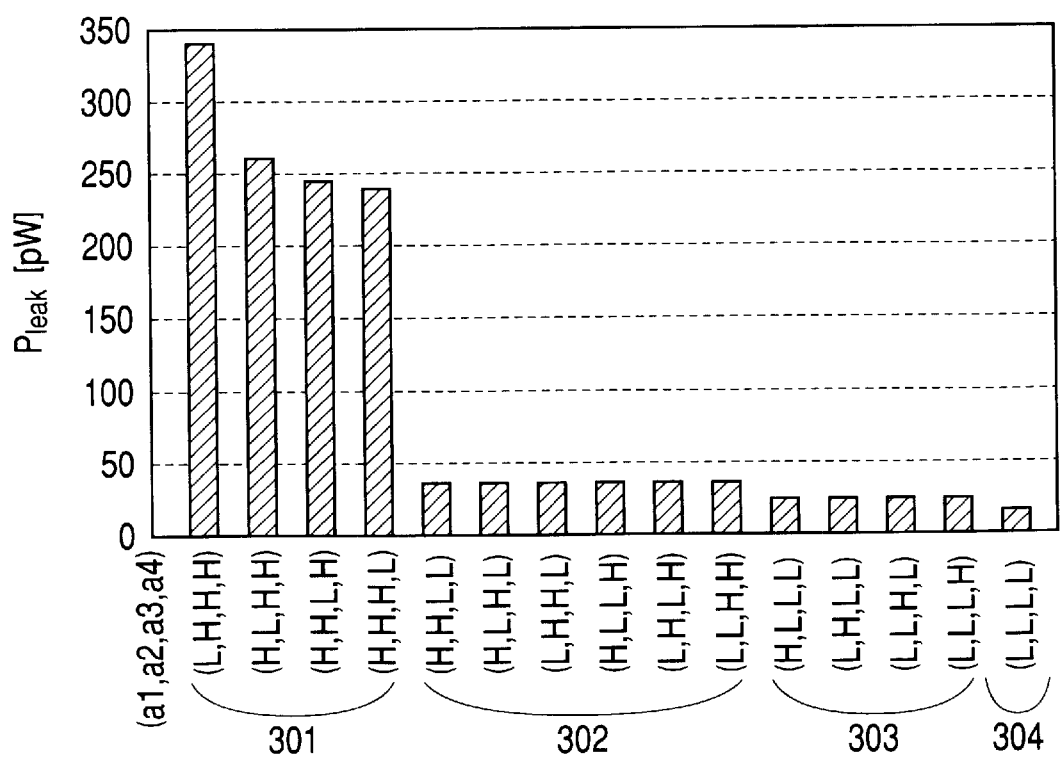

FIG. 3A shows a circuit diagram of a 4-input NAND gate and FIG. 3B shows simulation results of the relationship between each input signal (a1, a2, a3, a4) and the power consumption Pleak caused by a leakage current of the 4-input NAND gate. The simulation proceeds under the same conditions as that in FIG. 2B except that the three input gate shown in FIG. 2B is replaced with a four input gate. Reference numeral 301 denotes that one of the four inputs is "L," and reference numeral 302 denotes that two of the four inputs are "L." Reference numeral 303 denotes that three of the four inputs are "L," and reference numeral 304 denotes that all of the four inputs are "L." In this case, a plurality of NMOSs are turned off in eleven of the fifteen input patterns shown in FIG. 3B, and the power consumption caused by a leakage current is reduced significantly.

The three main reasons why the leakage current reduction effect is significant for multiple-input logic gates is described below.

(1) The drain-source potential difference of each off-state MOS is reduced. In the example shown in FIG. 2B, when only one NMOS is off (201), the source-drain potential difference of the off-state MOS becomes equal to the potential difference between the output node Zn and the ground potential VSS (assuming that the difference is V). On the other hand, when two NMOSs are off (202), the potential difference V is divided and applied to two stack NMOSs, whereby the source-drain potential difference in each of the two off-state MOSs becomes about V/2. When the source-drain potential difference is reduced, the MOS threshold voltage increases, and the subthreshold current is reduced significantly.

(2) Especially for a logic gate with three or more inputs, the probability that a plurality of stack MOSs are turned off increases. While the probability of a 2-input logic gate is ¼, that of a 3-input logic gate becomes ½ and that of a 4-input logic gate becomes 11/16. Consequently, it is possible to suppress the average power consumption caused by a leakage current lower in proportion to an increase in the number of inputs (that is, the number of stack MOSs). This means that the power consumption of a 2-input logic gate, caused by a leakage current, increases more when the 2-input logic gate is comprised of low threshold voltage MOSs. For a logic gate with 3 or more inputs comprised of low threshold voltage MOSs, the power consumption caused by a leakage current does not increase as much.

(3) When a stack MOS substrate (well) is connected to a supply voltage potential as shown in FIG. 2A and FIG. 3A, a substrate bias effect appears when the NMOS is turned off. The threshold voltage of the NMOS thus rises, and the subthreshold current falls.

FIG. 2A and FIG. 3A show NAND circuits. In the CMOS circuit, the NOR circuit is symmetrical. In the NAND circuit, both NMOS and PMOS are symmetrical. Therefore, the discussion on the NAND circuits shown in FIG. 2B and FIG. 3B also fit the NOR circuit (PMOSs are stacked in this case). In addition, the present invention can be applied to any type gate cell in which any circuit other than the NAND and NOR circuits includes such a compound logic gate as an ANDNOR circuit if the circuit includes a plurality of MOSs of the same conductivity type, connected serially between power supplies.

Figure 1:
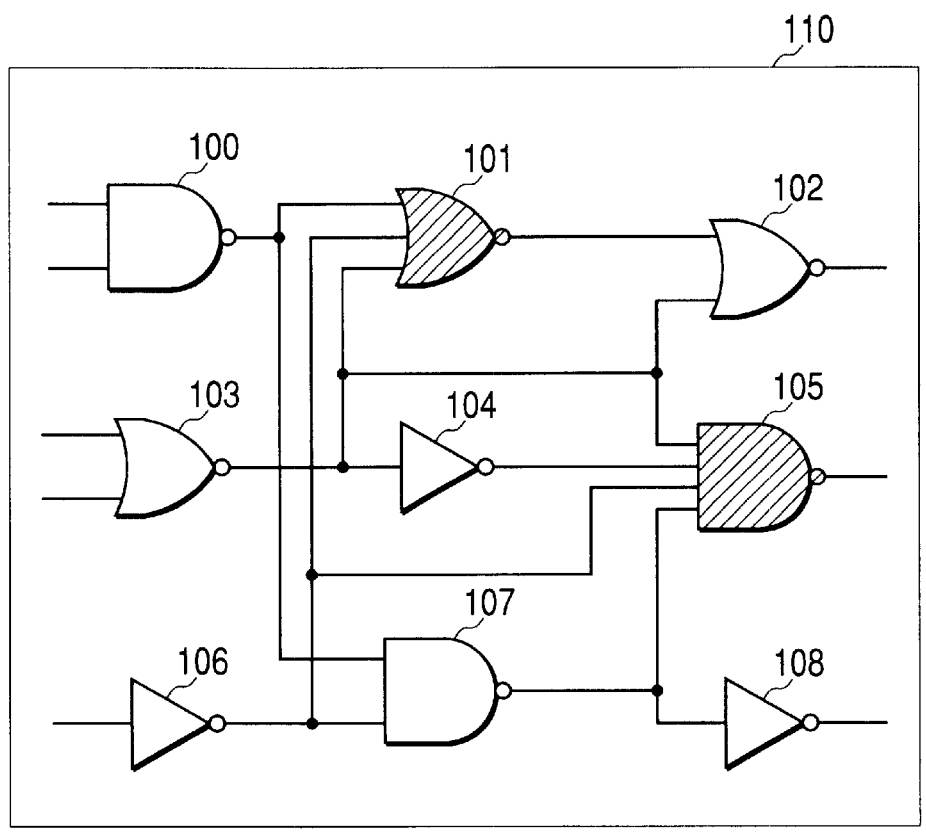
FIG. 1 is a block diagram of circuit blocks of a semiconductor integrated circuit according to the present invention.

FIG. 1 shows a representative embodiment of the present invention which is a semiconductor integrated circuit. A circuit block 110 includes gate cells (logic gates) 100 to 108. The gate cells that are meshed 101, 105 are a 3-input NOR gate and a 4-input NAND gate, each comprised of low threshold voltage MOSs. In this embodiment, in each circuit block, each logic gate with three or more inputs is comprised of low threshold voltage MOSs such way. Each logic gate with 2 or fewer inputs is comprised of high threshold voltage MOSs.

Figure 4A:
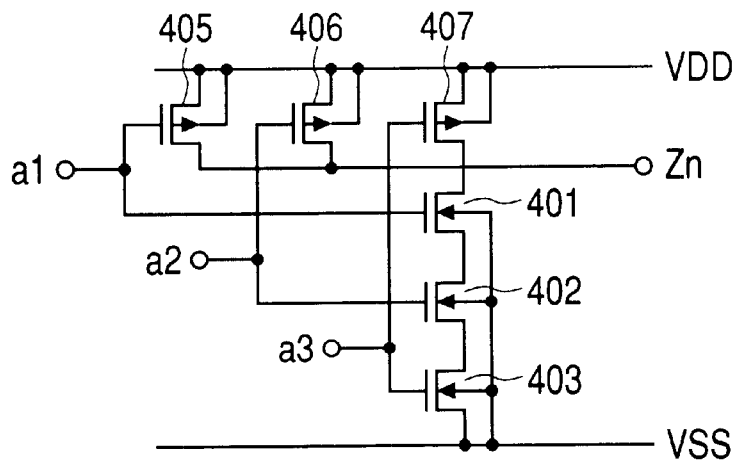
FIG. 4A is a first configuration of a logic gate (3-input NAND) circuit comprised of low threshold MOSs and FIG. 4B is a second configuration of the logic gate circuit (3-input NAND) comprised of low threshold voltage MOSs.
Figure 4B:
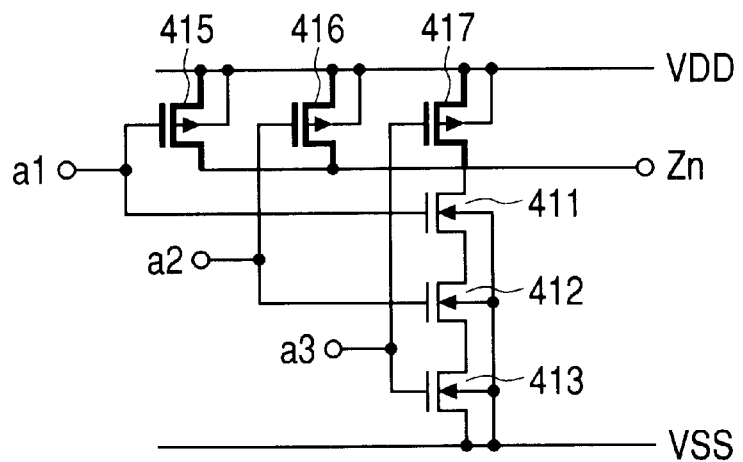

FIG. 4A and FIG. 4B show transistor level configuration examples of a logic gate comprised of low threshold voltage MOSs. In these examples, a 3-input NAND circuit is employed. In the circuit configuration shown in FIG. 4A, stack-structured MOSs of a first conductivity type (NMOSs 401, 402, 403) and MOSs of a second conductivity type (PMOSs 405, 406, 407) used for the complementary action with each of the MOSs of the first conductivity type are all low threshold voltage MOSs. In the circuit configuration shown in FIG. 4B, stack-structured MOSs of the first conductivity type (NMOSs 411 to 413) are all low threshold voltage MOSs, and MOSs of the second conductivity type (PMOSs 415 to 417) used for the complementary action with each of the MOSs of the first conductivity type are all high threshold voltage MOSs. Although the configuration in FIG. 4B is slower than that in FIG. 4A in operation, the configuration in FIG. 4B can suppress the subthreshold current that flows in the MOSs 415 to 417 when all the input signals are "H." The power consumption caused by a leakage current can thus be prevented from increasing.

The present invention may also be effective when a circuit block is comprised of three or more kinds of MOSs. In such a case, the MOSs to be stacked should preferably be low threshold voltage MOSs. To use both high and low threshold voltage MOSs selectively as those to be stacked, the threshold voltage should preferably be set higher for each MOS whose source is connected to a power supply line directly.

Next, a description will be made for a design method according to the present invention with reference to FIG. 5A. Logical description 501 is accomplished for the operation and function of a logical synthesis circuit with, for example, a register transfer level description such as VHDL, etc. Constraint 502 denotes specifications related to a delay time and power consumption required for a circuit formed through logical synthesis of the logical description 501. A cell library 503 includes information about many gate cells (e.g., inverter gates, NAND gates, and compound logic gates) enabled to execute basic logical functions. The gate cell information includes defined information about logical functions, external sizes, input/output terminals of cells as well as the positions of those input/output terminals, delay times, and power consumption of the cells.

The cell library 503 preferably includes a gate cell group 521 comprised of high threshold voltage MOSs (which have favorable power consumption properties) and another gate cell group 531 comprised of low threshold voltage MOSs (for fast operation). For example, a gate cell 522 functions as an inverter comprised of high threshold voltage MOSs, and a gate cell 532 functions as an inverter cell comprised of low threshold voltage MOSs. FIG. 5B shows circuit diagrams of the gate cells 522 and 532 on the transistor level respectively. Both PMOS and NMOS of the inverter 522 are high threshold voltage MOSs, and both PMOS and NMOS of the inverter 532 are low threshold voltage MOSs.

The gate cell 523 is a 3-input NAND cell comprised of high threshold voltage MOSs, and each of the gate cells 533a and 533b is a 3-input NAND cell comprised of low threshold voltage MOSs. In other words, the gate cell 533a belongs to, for example, the type disclosed in FIG. 4A, and the gate cell 533b belongs to, for example, the type disclosed in FIG. 4B. On the other hand, the gate cell 523 is comprised of transistors that are all high threshold voltage MOSs. Typically, only one of the gate cell 533a and 533b will be useful for a given circuit.

The semiconductor integrated circuit of the present invention does not necessarily require two types of gate cells provided with the same logical function and comprised of low and high threshold voltage MOSs. However, the gate cells that execute the same logical function should be the same in external size and position of input/output terminals. As described below, different kinds of gate cells can be realized by varying the threshold voltage with the channel implantation density.

The logical synthesis 504 is accomplished through the use of the logical description 501, the constraint 502, and the cell library 503. The logical synthesis 504 includes a cell allocation step 511 and a specification verification step 512. The cell allocation step 511 optimizes the logic described in the logical description 501 by estimating the delay time, etc., thereby allocating each gate cell included in the cell library 503. This cell allocation step 511 is executed in accordance with a cell allocation condition 513 at this time. In other words, each 1-input logic gate is selected from the gate cell group 521 that includes gate cells comprised of high threshold voltage MOSs, and each logic gate with three or more inputs is selected from the gate cell group 531 that includes gate cells comprised of low threshold voltage MOSs. Each 2-input logic gate should preferably be selected from the gate cell group 521 that includes gate cells comprised of high threshold voltage MOSs, because the leakage current reduction effect of the 2-input logic gate is smaller than that of the logic gate with three or more inputs and because there are only a few logic gates enabled to form a so-called "critical path."

This cell allocation step 511 enables a net list 505 to be obtained. The net list 505 represents a circuit to be synthesized logically by connections between gate cells. The specification verification step 512 verifies the operation of each circuit through logical simulation (and the like) with respect to whether or not this net list 505 satisfies the specifications (e.g., delay time and power consumption) regulated by the constraint 502.

When the specifications are satisfied, the logical synthesis is terminated. When the specifications are not satisfied, the net list 505 must be corrected. One such correction method is to correct the logical description 501. Another method is to ease the cell allocation condition 513 and perform the logical synthesis 504 again. For example, it is also effective to replace logic gates that belong to the gate cell group 521 among those determined not to satisfy the specifications in a path with gate cells belonging to the gate cell 531. The latter correction method is the same as that of the conventional technique. According to the design method of the present invention, however, the number of times which the correction is repeated is less than that of the conventional technique because the operation has already been sped up to a certain extent in the first logical synthesis.

These process steps are preferably executed by a computer system (not shown). The first subprogram corresponding to the cell allocation step 511 and a logical synthesis program that includes the second subprogram corresponding to the specification verification step 512 are read into the computer system and executed there.

Figure 6:
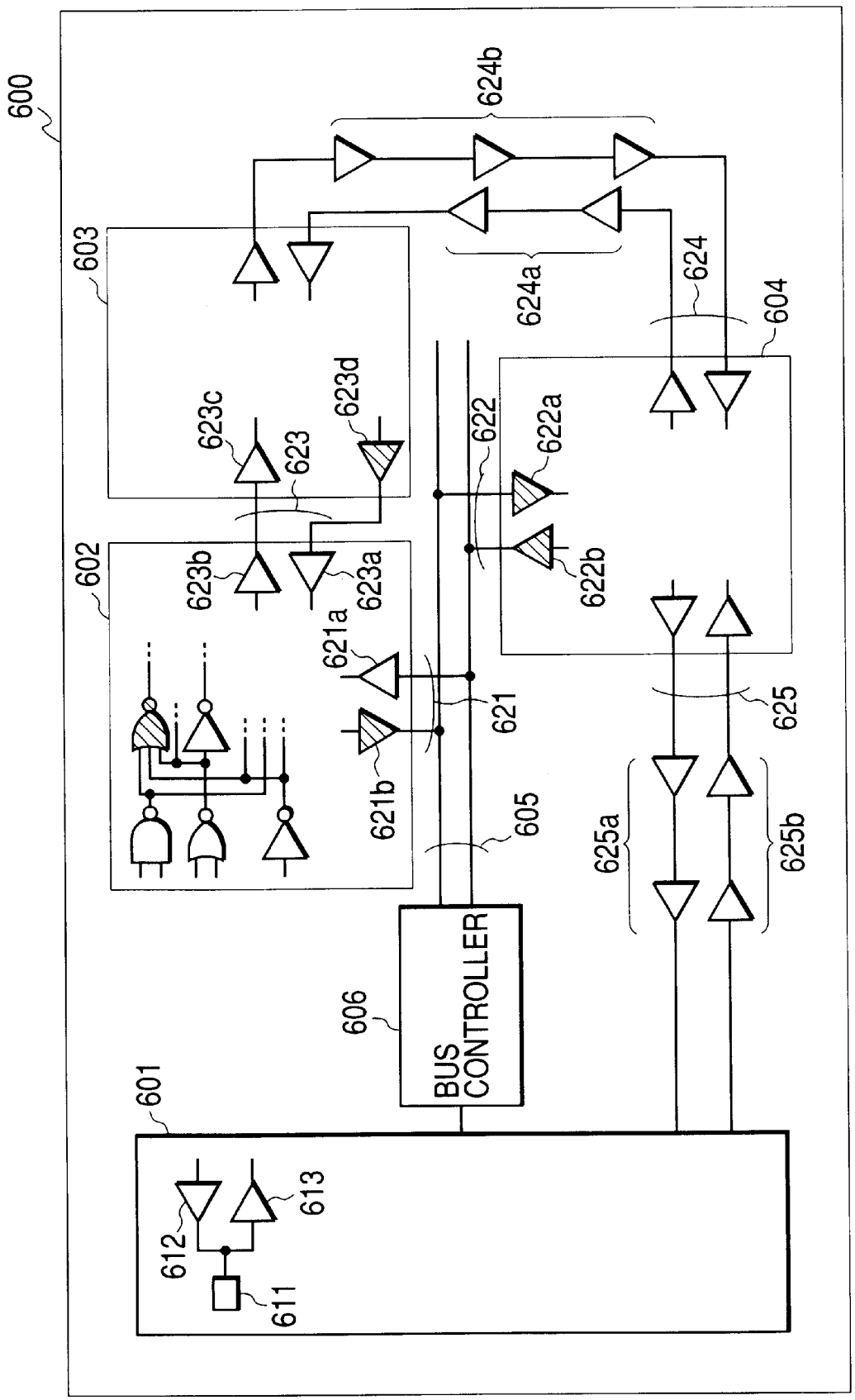
FIG. 6 is a circuit diagram of the semiconductor integrated circuit of the present invention.

FIG. 6 shows a model of a semiconductor integrated circuit 600 according to the present invention. Circuit blocks 602 to 604, which are internal logic circuits are equivalent to the circuit block 119 shown in FIG. 1. Specifically, each of these circuit blocks is a CPU, an FPU, or a logic circuit comprised by the user. In an I/O block 601, a pad 611 is connected to an output buffer 612 and an input buffer 613. The operating voltage of the input and output buffers 612, 613 is usually higher than that of other circuit blocks.

An internal bus 605 is connected to a plurality of circuit blocks 602, 604 via signal lines 621, 622, as well as to the I/O block 601 via a bus controller 606.

The circuit blocks and the I/O block are connected to other items not only via the internal bus, but also directly. For example, in FIG. 6, the circuit blocks 602 and 603, the circuit blocks 603 and 604, and the circuit block 604 and the I/O block 601 are connected to each other via signal lines 623, 624, and 625, respectively.

Each of bus drivers 621b and 622b for driving the internal bus 605 is usually comprised of an inverter circuit. However, because the load capacity of the internal bus 605 is large, such an inverter circuit should preferably use gate cells comprised of low threshold voltage MOSs so as to avoid a reduction in the operating speed caused by an insufficient driving power. Gate cells comprised of low threshold voltage MOSs should also be used for signal drivers (e.g., 623d) used to drive rather long signal lines such as the signal line 623. However, gate cells comprised of high threshold voltage MOSs should preferably be used (e.g., 623d) when the signal line is comparatively short or when the driving load is low. According to the method described above, the power consumption of a semiconductor integrated circuit provided with many signal line drivers may be effectively reduced.

On the other hand, each signal line 624, 625 is long and has a large load capacity. In such a case, each signal line 624, 625 uses a plurality of drivers (624a/b, 625a/b), each of which comprises a repeater. At this time, such drivers may be connected serially over several steps to increase the whole driving power, thereby preventing the operating speed of the integrated circuit from falling. In this case, because each driver driving power does not need to be so high, it is possible to employ gate cells comprised of high threshold voltage MOSs. Further, because each driver uses high threshold voltage MOSs, the power consumption caused by a leakage current is low.

Figure 5A:
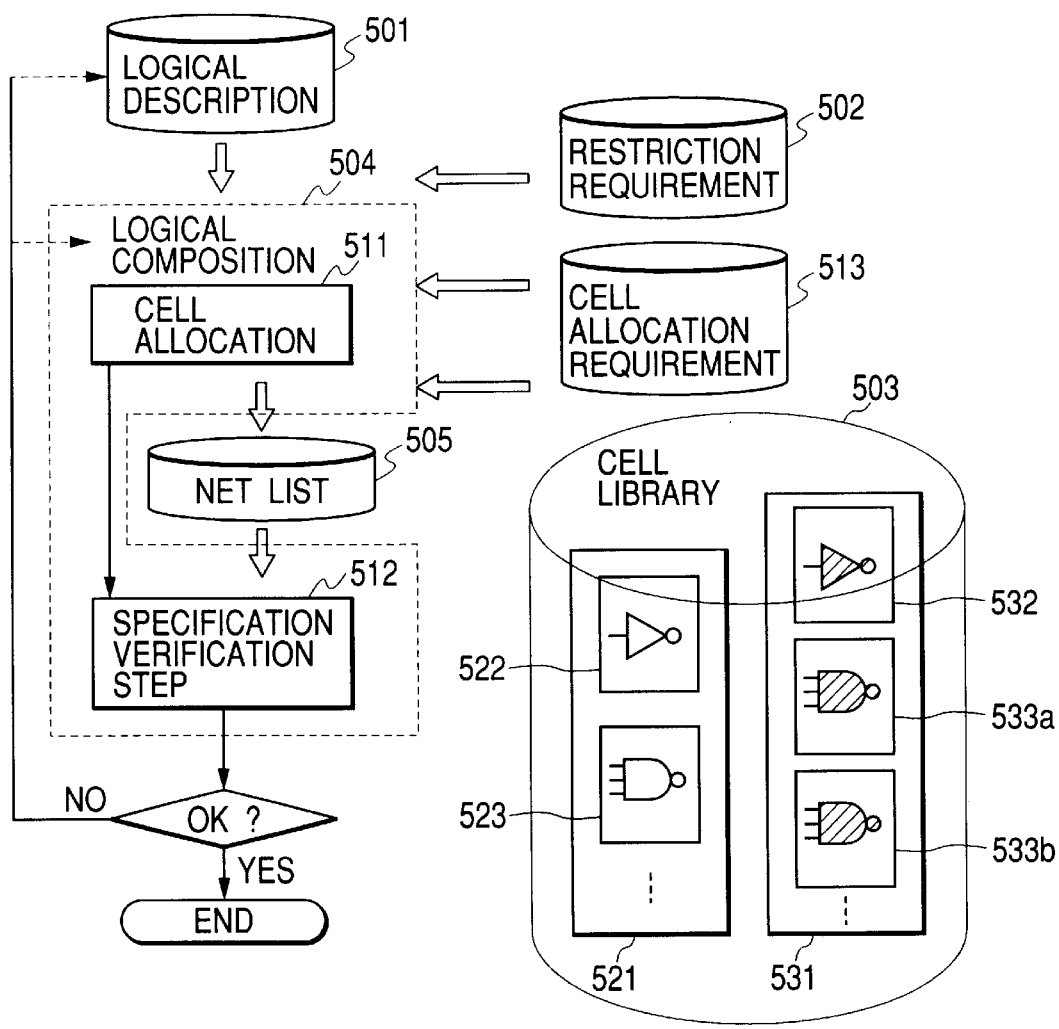
FIG. 5A is a method for designing the semiconductor integrated circuit of the present invention and FIG. 5B is an inverter circuit on a gate cell transistor level, provided in a cell library shown in FIG. 5A.
Figure 5B:
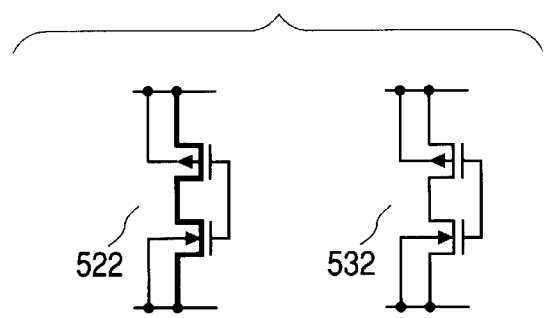

Whether to use low threshold voltage drivers, high threshold voltage drivers, or high threshold voltage for a repeater can be specified in the constraint 502 and the cell allocation condition 513 shown in FIG. 5A. In other words, when the output of a gate cell is connected to an input of another gate cell included in the same circuit block, and the output of a gate cell drives a circuit element outside the circuit block, the choice of which driver to be used should be decided individually in accordance with the cell allocation condition shown in FIG. 5A.

Figure 7:
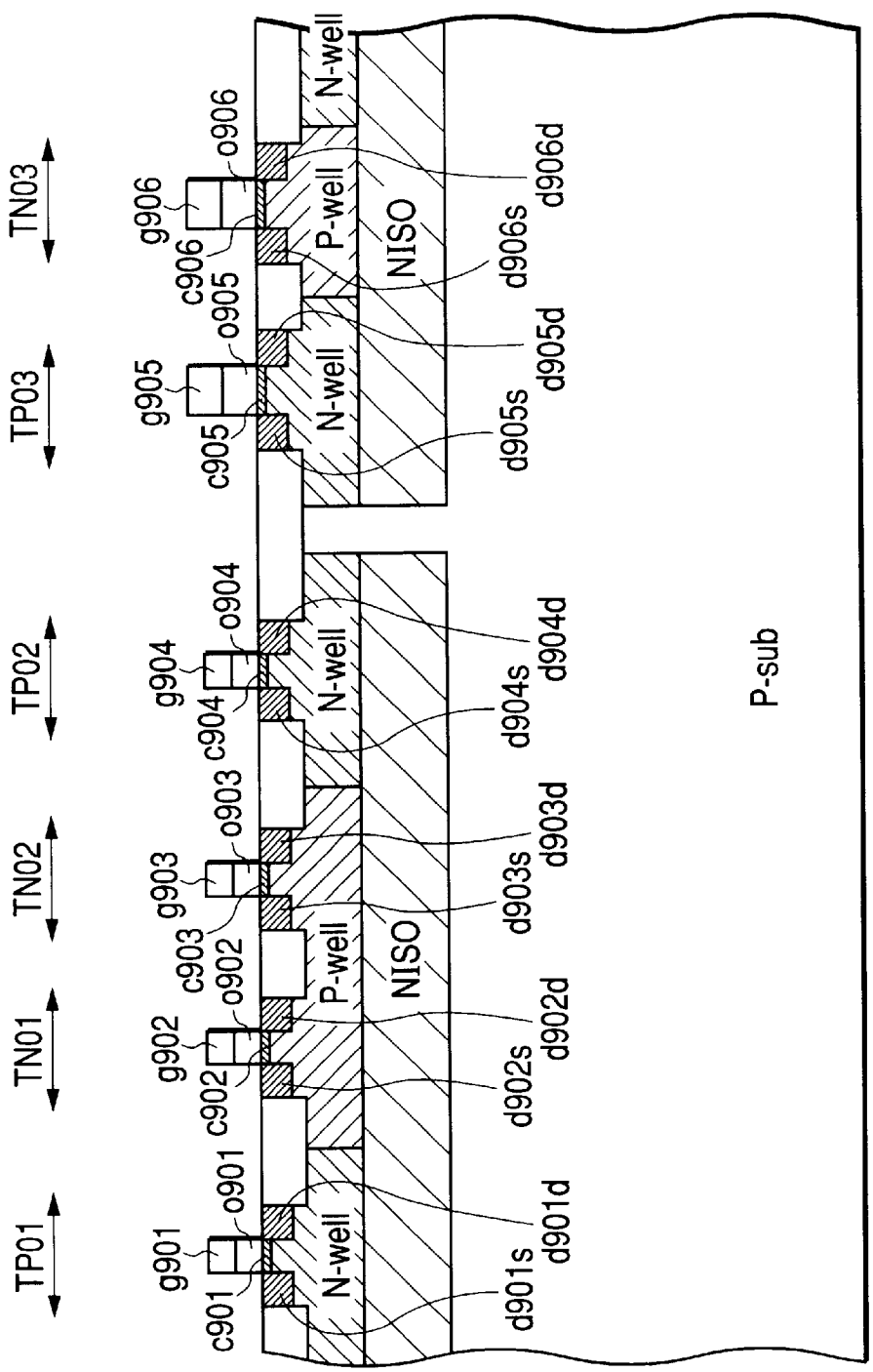
FIG. 7 is a cross sectional view of a MOS used in the semiconductor integrated circuit of the present invention.

FIG. 7 shows a cross sectional view of the semiconductor integrated circuit shown in FIG. 6 and the structure of the MOS used in each circuit in the integrated circuit. Each PMOS is formed in an N-type well N-well and each NMOS is formed in a P type well P-well. The semiconductor device shown in FIG. 7 is structured as a so-called "triple well" device. The device is provided with N type wells NISO that are deeper than N type wells N-well. The P type substrate is separated from P type wells P-well in the device. Reference numerals g901 to g906 are gate electrodes, o901 to o906 are gate insulators, c901 to c906 are channels, d901s to d906s are source diffusion areas, and d901d to d906d are drain diffusion areas.

PMOS TP03 and NMOS TN03 are transistors used for input/output buffers (612, 613 in FIG. 6). As described above, a high voltage is applied to the input/output buffers. For example, the operating voltage of the input/output buffers is 3.3 V while that of other logical blocks is 1.0 V. Consequently, the gate insulators o905 and o906 are preferably thicker ($S_iO_2$ layer 8 nm) than that of transistors included in other circuit blocks. The threshold voltage thereof is the highest in the semiconductor integrated circuit. For example, the threshold voltage $V_{th}3P$ of the T003 is $-0.7$ V and that $V_{th}3N$ of the TN03 is 0.7 V.

PMOS TP01, TP02, as well as NMOS TN01 and TN02 are MOSs used for the circuit blocks 602 to 605 shown in FIG. 6. The gate insulator of those MOSs is ($S_iO_2$ layer 3.2 nm) and thinner than that of the transistors used for the input/output buffers, MOS TP01 and TN01 are MOSs used for each gate cell of the present invention comprised of high threshold voltage MOSs, as well as for some of the gate cells (MOS 415 to 417) comprised of low threshold voltage MOSs as shown in FIG. 4B. For example, the threshold voltage $V_{th}1P$ of the TP01 is $-0.4$ V and that $V_{th}1N$ of the TN01 is 0.4 V. The MOS TP02 and TN02 are MOSs used for each gate cell of the present invention comprised of low threshold voltage MOSs. Those MOSs are equivalent to the MOSs 401 to 407 shown in FIG. 4A and MOSs 415 to 417 shown in FIG. 4B. For example, the threshold voltage $V_{th}2P$ of the TP02 is $-0.3$ V and that $V_{th}2N$ of the TN02 is 0.3 V.

There are many conventional methods for adjusting the threshold voltage in each of TP01 and TP02 or each of TN01 and TN02. For example, the gate insulator thickness/gate length can be changed to adjust the threshold voltage. However, the threshold voltage should preferably be adjusted by changing the impurity concentration in the channel under each gate electrode with channel implementation density as shown in FIG. 7. When the thickness of a gate insulator is to be changed, the number of masks might increase. When a gate length is to be changed, the cell size might differ among gate cells having the same logical function. To avoid such troubles, therefore, the channel implementation density should be employed to adjust a threshold voltage.

While the present invention has been described in the above embodiment, it is to be understood that modifications will be apparent to those skilled in the art without departing from the spirit of the present invention. For example, the semiconductor integrated circuit of the present invention may also be provided with a well-known switch and a mechanism for reducing the stand-by time power consumption by controlling the substrate bias.

According to the present invention, it is possible to provide a semiconductor integrated circuit that is well-balanced between fast operation and power consumption caused by a leakage current. It is also possible to provide a method for enabling the logical synthesis of circuits for the design of the above semiconductor integrated circuit in a short period of time.

Nothing in the above description is meant to limit the present invention to any specific materials, geometry, or orientation of parts. Many part/orientation substitutions are contemplated within the scope of the present invention. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A semiconductor integrated circuit, comprising:
   a first operating potential point;
   a second operating potential point;
   a plurality of first logic gates in each of which a first insulated gate field effect transistor of a first conductivity type is included among a plurality of insulated gate field effect transistors connected serially between said first and second operating potential points, while no other insulated gate field effect transistor of the first conductivity type is included among said plurality of insulated gate field effect transistors connected serially between said first and second operating potential points; and
   a plurality of second logic gates in each of which at least three second insulated gate field effect transistors of the first conductivity type are included among a plurality of insulated gate field effect transistors connected serially between said first and second operating potential points,
   wherein the absolute threshold voltage of said second insulated gate field effect transistors is smaller than that of said first insulated gate field effect transistor.

2. The semiconductor integrated circuit according to claim 1, wherein each of said first and second logic gates are CMOS logic gates.

3. The semiconductor integrated circuit according to claim 2, wherein each of said second logic gates further includes a third insulated gate field effect transistor of a second conductivity type, which shares input signals with said second insulated gate field effect transistors.

4. The semiconductor integrated circuit according to claim 3, wherein an absolute threshold voltage of said third insulated gate field effect transistor is larger than that of said second insulated gate field effect transistors.

5. The semiconductor integrated circuit according to claim 3,
   wherein a difference between the absolute threshold voltage of said first insulated gate field effect transistor and that of said third insulated gate field effect transistor is larger than a difference between the absolute threshold voltage of said second insulated gate field effect transistors and that of said third insulated gate field effect transistor.

6. The semiconductor integrated circuit according to claim 4,
   wherein a difference between the absolute threshold voltage of said first insulated gate field effect transistor and that of said third insulated gate field effect transistor is larger than a difference between the absolute threshold voltage of said second insulated gate field effect transistors and that of said third insulated gate field effect transistor.

7. The semiconductor integrated circuit according to claim 1;
   wherein a difference between the absolute threshold voltage of said first insulated gate field effect transistor and that of said second insulated gate field effect transistors depends upon a change of the impurity concentration in the channel of each of said first and second insulated gate field effect transistors.

8. The semiconductor integrated circuit according to claim 1, further comprising:
   a third logic gate in which a fourth insulated gate field effect transistor of a third conductivity type is included among a plurality of insulated gate field effect transistors connected serially between said first and second operating potential points, while no other insulated gate field effect transistor of the third conductivity type is included among said insulated gate field effect transistors connected serially between said first and second operating potential points in the third logic gate;

wherein said third logic gate is used for a signal line driver.

9. The semiconductor integrated circuit according to claim 8, wherein a difference between the absolute threshold voltage of said first insulated gate field effect transistors and that of said fourth insulated gate field effect transistors is larger than a difference between the absolute threshold voltage of said second insulated gate field effect transistors and that of said fourth insulated gate field effect transistors.

10. The semiconductor integrated circuit according to claim 1, further comprising:

an internal circuit block that includes a plurality of said first and second logic gates; and an I/O block that includes an input/output buffer, wherein the absolute threshold voltage of an insulated gate field effect transistor used as a member of said input/output buffer is larger than that of said first insulated gate field effect transistors.

11. The semiconductor integrated circuit according to claim 10, wherein the gate insulator of said insulated gate field effect transistor used as a member of said input/output buffer is thicker than that of said first insulated gate field effect transistor and that of said second insulated gate field effect transistors.

* * * * *